United States Patent [19]

Matsuura

[11] Patent Number: 4,611,179

[45] Date of Patent: Sep. 9, 1986

[54] WIDE-BAND TYPE HIGH-FREQUENCY AMPLIFIER CIRCUIT

[75] Inventor: Syuuji Matsuura, Ikoma, Japan

[73] Assignee: Sharp Kabushiki Kaisha, Osaka, Japan

[21] Appl. No.: 741,472

[22] Filed: Jun. 5, 1985

[30] Foreign Application Priority Data

Jun. 5, 1984 [JP] Japan .................................. 59-83771

[51] Int. Cl.[4] ............................................. H03F 1/34
[52] U.S. Cl. ..................................... 330/293; 330/102
[58] Field of Search ................ 330/102, 293, 291, 103

[56] References Cited

U.S. PATENT DOCUMENTS 3,898,577  8/1975  Halsey ................................. 330/102

Primary Examiner—Gene Wan
Attorney, Agent, or Firm—Birch, Stewart, Kolasch and Birch

[57] ABSTRACT

A wide-band type high-frequency amplifier circuit characterized in that a voltage feedback circuit is connected across a base and a colletor of an amplifier transistor, a current feedback circuit is inserted into an emitter circuit, and a damper resistance and a condenser having a small capacity are connected to a balun transformer of a collector circuit in parallel.

13 Claims, 2 Drawing Figures

WIDE-BAND TYPE HIGH-FREQUENCY AMPLIFIER CIRCUIT

BACKGROUND OF THE INVENTION

The present invention relates to a wide-band type high-frequency amplifier circuit and, more particularly, to an improved wide-band type high-frequency amplifier circuit which can be used in a converter for cable television (CATV).

When a wide-band type high-frequency amplifier circuit is used in a converter for a CATV, the wide-band type high-frequency amplifier circuit having a wide-band area between about 50 MHz and about 450 MHz requires a gain between about 7 dB and about 10 dB and a flat characteristic within about 2 dB. Additionally, this circuit requires an impedance characteristic of a return-loss more than about 10 dB.

However, the conventional wide-band type high-frequency amplifier circuit cannot satisfy the above requirements. It is desired, therefore, that an improved wide-band type high-frequency amplifier circuit for preventing the reduction of gain over the high-band area and for obtaining a flat-characteristic of less than about 2 dB over the whole band area (for example, a band area between about 50 MHz be provided and about 450 MHz.

SUMMARY OF THE INVENTION

Accordingly, it is an object of the present invention to provide an improved wide-band type high-frequency amplifier circuit which can exactly amplify frequencies over a wide-band area.

It is another object of the present invention to provide an improved wide-band type high-frequency amplifier circuit which can prevent the reduction of gain over a high-band area.

It is still another object of the present invention to provide an improved wide-band type high-frequency amplifier circuit which can obtain a flat power gain characteristic of less than about 2 dB over the entire band area.

It is still another object of the present invention to provide an improved wide-band type high-frequency amplifier circuit which can be used in a converter for a cable television (CATV).

Other objects and further scope of applicability of the present invention will become apparent from the detailed description given hereinafter. It should be understood, however, that the detailed description of and specific examples, while indicating preferred embodiments of the invention, are given by way of illustration only, since various changes and modifications within the spirit and scope of the invention will become apparent to those skilled in the art from this detailed description.

To achieve the above object, according to an embodiment of the present invention, a wide-band type high-frequency amplifier circuit is characterized in that a voltage feedback circuit is connected across a base and a collector of an amplifier transistor, a current feedback circuit is inserted into an emitter circuit, and a damper resistance and a condenser having a small capacity are connected to a balun transformer of a collector circuit in parallel.

BRIEF DESCRIPTION OF THE DRAWINGS

The present invention will be better understood from the detailed description given hereinbelow and the accompanying drawings which are given by way of illustration only, and thus are not limitative of the present invention and wherein.

DETAILED DESCRIPTION OF THE INVENTION

Figure 1:
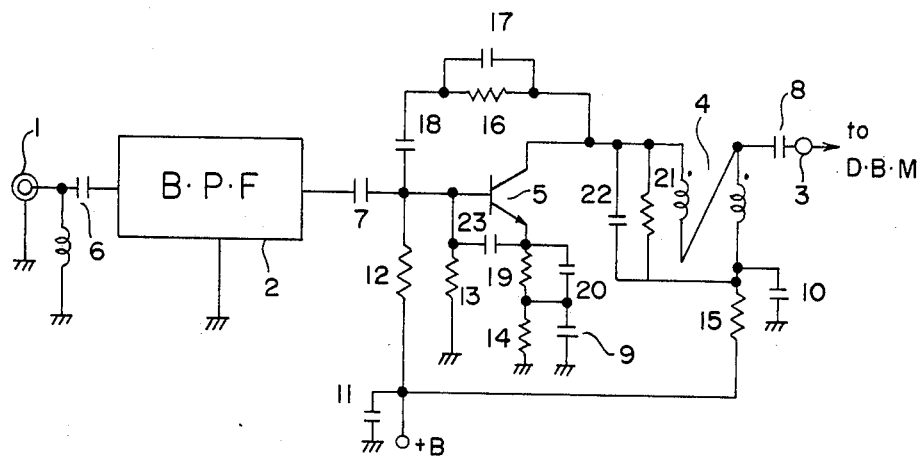
FIG. 1 shows a circuit diagram of a wide-band type high-frequency amplifier circuit according to an embodiment of the present invention.

Referring to FIG. 1, there is shown a circuit diagram of a wide-band type high-frequency amplifier circuit according to an embodiment of the present invention.

A reference numeral 1 designates an input terminal of an input circuit, a reference numeral 2 designates a band-pass filter (B.P.F.) for passing a frequency between about 50 MHz and about 450 MHz, a reference numeral 3 designates an output terminal of an output circuit, a reference numeral 4 designates a balun transformer which functions as a transmission wiring transformer, a reference numeral 5 designates a transistor for an amplification of high-frequencies, and +B designates a DC power supply source for supplying a positive power voltage.

In this circuit, a high-frequency signal inputted from the input terminal 1 through the band-pass filter 2, which has frequencies between about 50 MHz and about 450 MHz, is applied to a base of the transistor 5. The high-frequency signal amplified by the transistor 5 is applied to a double balance mixer (D.B.M.) through the transformer 4 from a collector of the transistor 5. Reference numerals 6, 7 and 8 designate direct current blocking condensers, reference numerals 9, 10 and 11 designate by-pass condensers, reference numerals 12, 13, 14 and 15 designate bias resistances.

The transistor 5 for an amplification has a transition frequency $f_T$ equal to or more than about 5 GHz.

A voltage feedback circuit comprising a parallel circuit of a resistance 16 and a condenser 17 is connected across the base-collector of the transistor 5 through a direct current blocking condenser 18. A current feedback circuit comprising a parallel circuit of a resistance 19 and a condenser 20 is connected between the emitter of the transistor 5 and the bias resistance 14.

The balun transformer 4 at the side of the output circuit is connected to a damper resistance 21 and a condenser 22, having a small capacity, in parallel to form a relatively wide-band parallel resonance circuit (called a parallel peaking circuit). The resonance frequency of the parallel resonance circuit is set around about 450 MHz. In this circuit, the reduction of gain at a high-band is eliminated, so that the flat power gain characteristic is obtained over the whole transmission band area between about 50 MHz and about 450 MHz.

To amend or correct a lead inductance across the base-emitter of the transistor 5, a lead inductance produced by the pattern-design of a printing board and the inducton of the output impedance of the band-pass filter 2, a condenser 23 having a small capacitance is inserted between the base-emitter of the transistor 5. By inserting the condenser 23, both a noise factor and the gain characteristic can be improved with the amendment of the impedance.

Figure 2:
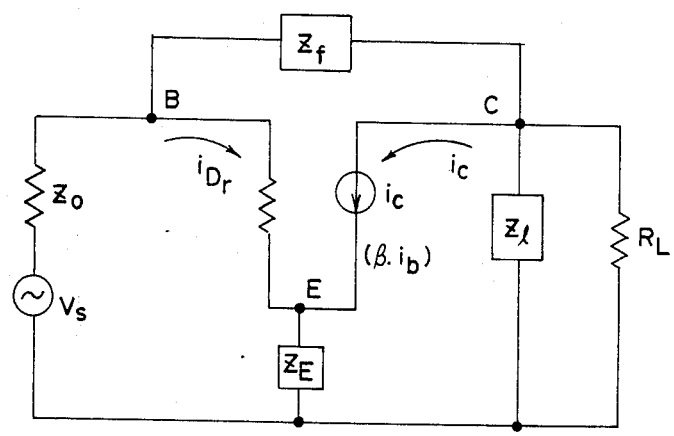
FIG. 2 shows an equivalent circuit of FIG. 1.

FIG. 2 shows an equivalent circuit of the wide-band type high-frequency amplifier circuit of FIG. 1. In FIG. 2, $V_S$ designates an input signal source, $Z_0$ designates an impedance for the signal source, r designates a base input resistance, $Z_f$ designates a voltage feedback impedance, $Z_E$ designates a current feedback impedance, $Z_1$ designates a load impedance, $R_1$ designates a load resistance, $i_b$ deisgnates a base current, $i_c$ designates a collector current, and designates a current amplification factor.

As described above, according to the wide-band type high-frequency amplifier circuit of the present invention, the voltage feedback circuit is inserted between the base-collector of the transistor for the amplification, the current feedback circuit is inserted in the emitter circuit. Further, the balun transformer at the side of the output circuit is connected to the damper resistance and the condenser, having a small capacitance, in parallel, so that the reduction of gain at the high-band area is eliminated. Also, a flat power gain characteristic of less than about 2 dB over the predetermined whole band area, for example, the band area for cable television (about 50 MHz to about 450 MHz) can be obtained.

By selecting the feedback impedance value of each of the voltage feedback circuit and the current feedback circuit, the return-loss as the input impedance characteristic becomes more than about 10 dB over the predetermined whole band area. In this case, the balun transformer, at the side of the input circuit, can be eliminated.

Preferably, the capacitance of each of the condensers 22 and 23 may be about 1 picofarad.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A wide-band type high-frequency amplifier circuit comprising:

transistor means for amplifying a wide-band type high frequency signal, said transistor means having a base, collector and emitter;

first frequency responsive reactance means, operatively connected across the base and collector of said transistor means for providing voltage feedback to said transistor means;

second frequency responsive reactance means, operatively connected across the base and the emitter of said transistor means, for providing current feedback wherein said second frequency responsive reactance means consists essentially of a parallel connection of a resistance and a condenser; and a parallel resonance circuit connected to the collector of said transistor means.

2. The wide-band type frequency amplifier circuit of claim 1 wherein said transistor means is a transistor.

3. The wide-band high-frequency amplifier circuit of claim 2, wherein the parallel resonance circuit comprises a balun transformer connnected to the collector of said transistor and a circuit including a damper resistance and a first condenser connected to the balun transformer in parallel.

4. The wide-band type high frequency amplifier circuit of claim 3, wherein the first condenser has a small capacitance.

5. The wide-band type high-frequency amplifier circuit of claim 4, wherein the capacitance of the first condenser is about 1 picofarad.

6. The wide-band type high-frequency amplifier circuit of claim 1, wherein said first frequency responsive reactance means comprises a second resistance and a second condenser connected to each other in parallel.

7. The wide-band type high frequency amplifier circuit of claim 6, wherein said first frequency responsive reactance means is connected to a direct current blocking condenser.

8. The wide-band type high-frequency amplifier circuit of claim 1, wherein said second frequency responsive reactance means is connected to a bias resistance.

9. The wide-band type high-frequency amplifier circuit of claim 1, wherein a resonance frequency of the resonance circuit is set at about 450 MHz.

10. The wide-band type high-frequency amplifier circuit of claim 1, wherein the band area is between about 50 MHz and about 450 MHz.

11. The wide-band type high-frequency amplifier circuit of claim 1, wherein a fourth condenser is connected to between the base and emitter of the transitor.

12. The wide-band type high-frequency amplifier circuit of claim 11, wherein the fourth condenser has a small capacitance.

13. The wide-band type high-frequency amplifier circuit of claim 12, wherein the capacitance of the fourth condenser is about 1 picofrad.

* * * * *